United States Patent
Long et al.

(10) Patent No.: US 9,971,923 B2
(45) Date of Patent: May 15, 2018

(54) FINGERPRINT IDENTIFICATION DEVICE AND MOBILE TERMINAL HAVING SAME

(71) Applicant: Shenzhen Goodix Technology Co., Ltd., Shenzhen (CN)

(72) Inventors: Wei Long, Shenzhen (CN); Yixiang Qiu, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days. days.

(21) Appl. No.: 15/218,081

(22) Filed: Jul. 25, 2016

(65) Prior Publication Data
US 2016/0335468 A1 Nov. 17, 2016

Related U.S. Application Data

(63) Continuation of application No. PCT/CN2014/084560, filed on Aug. 15, 2014.

(30) Foreign Application Priority Data

Jan. 28, 2014 (CN) .......................... 2014 1 0042178

(51) Int. Cl.
*G06K 9/00* (2006.01)

(52) U.S. Cl.
CPC ................... *G06K 9/0002* (2013.01)

(58) Field of Classification Search
CPC ............. G06K 9/0002; G06K 9/00885; G06K 9/00019; G06K 9/00026; G06K 9/00084; G06K 9/00065; G06K 9/00013; G06K 2009/00939
See application file for complete search history.

(56) References Cited

U.S. PATENT DOCUMENTS

| | | | |
|---|---|---|---|
| 6,098,330 A * | 8/2000 | Schmitt ................. | F41A 17/066 382/145 |
| 6,310,371 B1 * | 10/2001 | Hung ................. | G06K 9/00053 257/252 |
| 7,606,398 B2 * | 10/2009 | Nys.ae butted.ther ........... | G06K 9/0002 382/124 |
| 8,717,775 B1 * | 5/2014 | Bolognia ........... | G06K 9/00053 361/761 |

(Continued)

FOREIGN PATENT DOCUMENTS

| CN | 101562157 A | 10/2009 |
|---|---|---|
| CN | 102918546 A | 2/2013 |

(Continued)

*Primary Examiner* — Amir Alavi

(57) ABSTRACT

The present disclosure discloses a fingerprint identification apparatus and a mobile terminal using the same. The fingerprint identification apparatus includes: a fingerprint identification module, including a sensing circuit, a control circuit and a base plate, wherein the sensing circuit is arranged on the base plate via a support member and electrically connected to the base plate, and the control circuit is electrically connected to the base plate and located beneath the sensing circuit. a conductor holder, the conductor holder being provided with a through hole, covering the fingerprint identification module and electrically connected to the base plate; and a dielectric cover sheet, the dielectric cover sheet being assembled in the through hole and connected to the sensing circuit.

17 Claims, 3 Drawing Sheets

(56) References Cited

U.S. PATENT DOCUMENTS

| | | | |
|---|---|---|---|
| 2003/0215116 A1* | 11/2003 | Brandt | G06K 9/00053 382/124 |
| 2009/0073632 A1* | 3/2009 | Yang | G06K 9/00026 361/220 |
| 2010/0096710 A1 | 4/2010 | Chou | |
| 2013/0194071 A1* | 8/2013 | Slogedal | G06K 9/0002 340/5.82 |
| 2014/0056245 A1 | 2/2014 | Qin et al. | |
| 2015/0242672 A1* | 8/2015 | Benkley | G06K 9/0008 382/124 |
| 2016/0335468 A1* | 11/2016 | Long | G06K 9/0002 |
| 2016/0364036 A1* | 12/2016 | Deng | G06K 9/00 |
| 2016/0379036 A1* | 12/2016 | Long | G06K 9/00013 382/124 |
| 2017/0092622 A1* | 3/2017 | Wu | H01L 25/0657 |

FOREIGN PATENT DOCUMENTS

| | | |
|---|---|---|
| CN | 103400181 A | 11/2013 |
| CN | 203366350 U | 12/2013 |
| CN | 103699881 A | 4/2014 |
| CN | 103793691 A | 5/2014 |
| CN | 203630794 U | 6/2014 |
| JP | 2003083708 A | 3/2003 |
| JP | 2009048387 A | 3/2009 |
| KR | 1020120134080 A | 12/2012 |
| TW | 200630897 A | 9/2006 |
| TW | 200828561 A | 7/2008 |

\* cited by examiner

US 9,971,923 B2

FINGERPRINT IDENTIFICATION DEVICE AND MOBILE TERMINAL HAVING SAME

CROSS-REFERENCE TO RELATED APPLICATIONS

This application is a continuation of International Patent Application No. PCT/CN2014/084560, with an international filing date of Aug. 15, 2014, which claims priority to Chinese Patent Application No. 2014100421782, filed on Jan. 28, 2014, both of which are hereby incorporated by reference in its entireties.

TECHNICAL FIELD

The present disclosure relates to the filed of fingerprint identification, and in particular, relates to a fingerprint identification apparatus and a mobile terminal having the same.

BACKGROUND

The fingerprint identification apparatus has been widely used in various terminal devices, such as, a mobile terminal, a banking system, an attendance system, and the like. The most commonly used fingerprint identification apparatus is a type of finger swipe and a type of optical imaging, wherein the sensitivity of the finger swipe is poor, fingers stained or poor direction may cause malfunction; in the meantime, safeties of the finger swipe and the optical imaging are poor, and are easily cracked by a fingerprint copy.

The package of the fingerprint identification apparatus in the related arts is complicated, the structure thereof is large, the installation is hard, the required material technology and module packaging process are very high, the cost is high, and in the meantime, the production yield and efficiency are very low.

SUMMARY

The present disclosure may intend to solve at least one of the above problems in the related art.

To this end, one objective of the present disclosure is to provide a fingerprint identification apparatus which is small in structure.

Another objective of the present disclosure is to provide a mobile terminal having the above described fingerprint identification apparatus.

In an embodiment of the present disclosure, a fingerprint identification apparatus includes a fingerprint identification module, including a sensing circuit, a control circuit and a base plate, wherein the sensing circuit is arranged on the base plate via a support member and electrically connected to the base plate, and the control circuit is electrically connected to the base plate and located beneath the sensing circuit; a conductor holder, the conductor holder being provided with a through hole, covering the fingerprint identification module and being electrically connected to the base plate; and a dielectric cover sheet, the dielectric cover sheet being assembled in the through hole and connected to the sensing circuit, such that the sensing circuit collects fingerprints through the dielectric cover sheet pressed by a finger and generates an analog signal.

In the fingerprint identification apparatus of the present disclosure, the sensing circuit and the control circuit are integrated on the base plate, the sensing circuit is supported by the support member, and the control circuit is located beneath the sensing circuit. In this way, the structure of the fingerprint identification module may be reduced, and the structure of the fingerprint identification apparatus may be also reduced, which is convenient to assemble the fingerprint identification apparatus into the mobile terminal.

The mobile terminal according to the present disclosure includes the above fingerprint identification apparatus of the present disclosure.

Figure 1:
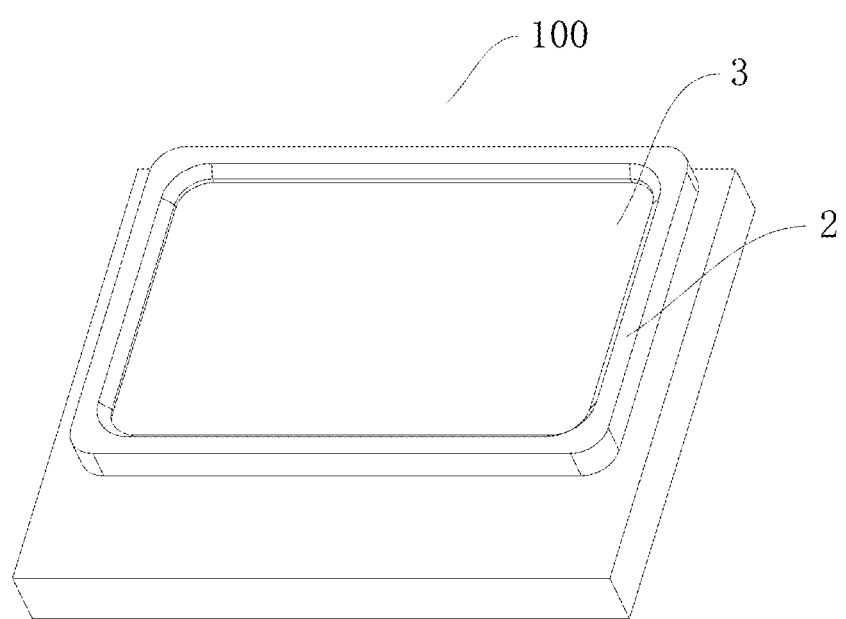
FIG. 1 is an assembly diagram of a fingerprint identification apparatus according to an embodiment of the present disclosure.

Reference numerals and denotations in the drawings:

A fingerprint identification apparatus 100, a fingerprint identification module 1, a sensing circuit 10, a control circuit 12, a base plate 13, a support member 14, a welding wire 15, a first protective adhesive 16a, a second protective adhesive 16b, a LED lamp 17, a conductive terminal 18, a flexible circuit board 19, an element 11, a conductor support 1, a through hole 20, and a dielectric cover sheet 3.

DETAILED DESCRIPTION

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

The fingerprint identification apparatus 100 according to an embodiment of the present disclosure is described hereinafter with reference to FIG. 1 to FIG. 4, which is applicable to a mobile terminal, such as, a mobile phone, a tablet computer, a laptop, a media player, and the like, and also is applicable to such financial terminal devices as an ATM, and the like.

As illustrated in FIG. 1 to FIG. 4, in an embodiment of the present disclosure, a fingerprint identification apparatus 100 includes a fingerprint identification module 1, a conductor holder 2, and a dielectric cover sheet 3, wherein the fingerprint identification module 1 includes a sensing circuit 10, a control circuit 12 and a base plate 13. The sensing circuit 10 is arranged on the base plate 13 via a support member 14 and electrically connected to the base plate 13, and the control circuit 12 is electrically connected to the base plate 13 and located beneath the sensing circuit 10. To be specific, in a direction from top to bottom, the fingerprint identification module 1 successively includes the sensing circuit 10, the control circuit 12 and the base plate 13, wherein a lower end of the support member 14 is arranged on the base plate 13, the sensing circuit 10 is arranged on an upper end of the support member 14, such that a space is confined between the sensing circuit 10 and the base plate 13, and the control circuit 12 is arranged on the base plate 13 and is located in the space confined between the sensing circuit 10 and the base plate 13, the control circuit 12 is electrically connected to the base plate 13. If the space confined between the sensing circuit 10 and the base plate 13 is large enough, another element 11 may be arranged on the base plate 13.

Figure 2:
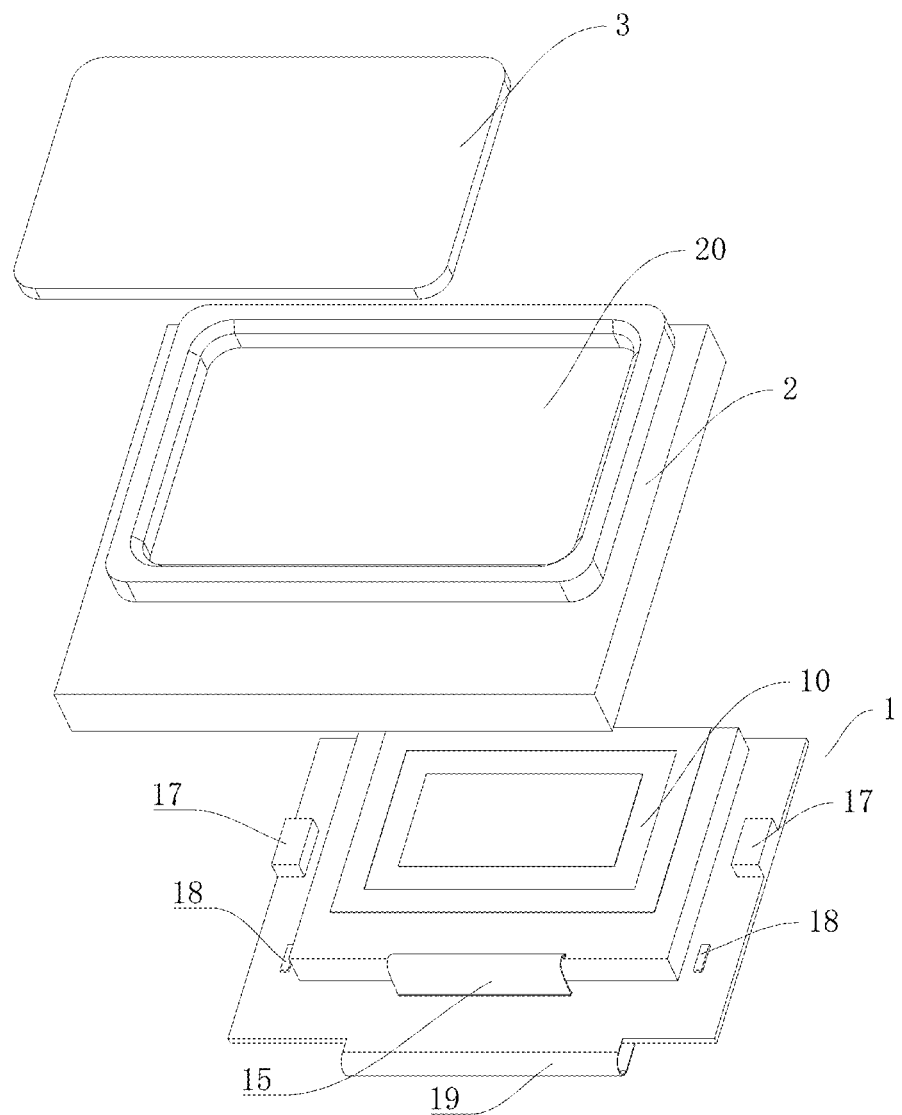
FIG. 2 and FIG. 3 are exploded schematic diagrams of a fingerprint identification apparatus from different perspectives according to an embodiment of the present disclosure.
Figure 3:
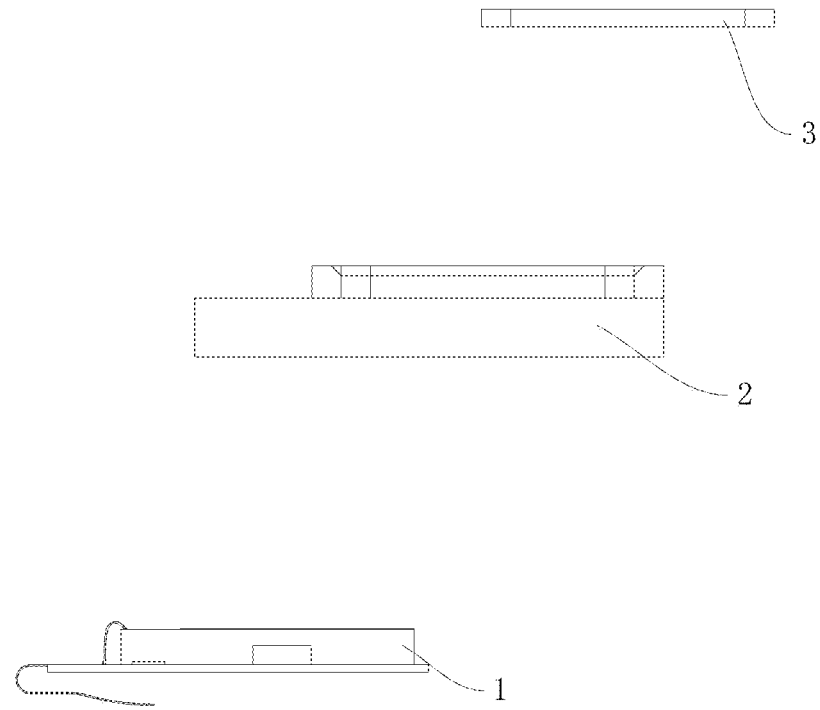
Figure 4:
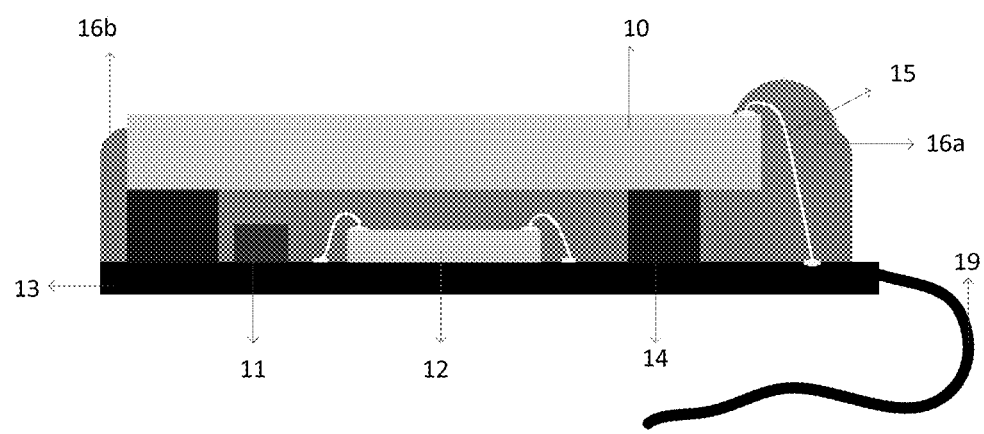
FIG. 4 is a sectional diagram of a fingerprint identification module in a fingerprint identification apparatus according to an embodiment of the present disclosure.

Specifically, a circuit is distributed on the base plate 13, which plays a role of interconnection and bridging and is also the process framework of the fingerprint identification module 1, wherein the circuit on the base plate 13 may be in a structure of a 2- or 4-layer board. In an example of the present disclosure, the base plate 13 may be a substrate or a flexible circuit board, or a rigid-flex circuit board. In a preferable embodiment of the present disclosure, as illustrated in FIG. 2 to FIG. 4, the base plate 13 is the substrate, and at this time, a flexible circuit board 19 is needed to connect on the substrate to connect to an external circuit.

The conductor holder 2 is provided with the through hole 20, it covers the fingerprint identification module 1 and is electrically connected to the base plate 13. Specifically, the conductor holder 2 is conductive material, and metal material is preferably selected. On one hand, the conductor holder 2 plays a role of architecture support to fix the entire fingerprint identification apparatus 100; on the other hand, the conductor holder 2 is configured to conduct pulse signals. The dielectric cover sheet 3 is assembled in the through hole 20 and connected to the sensing circuit 10, such that the sensing circuit 10 collects fingerprints through the dielectric cover sheet 3 pressed by a finger and generates an analog signal. To be specific, the sensing circuit 10 collects fingerprints through the dielectric cover sheet 3 pressed by the finger and generates the analog signal, and the sensing circuit 10 may be a multi-channel efficient sensing chip. In other words, the sensing circuit 10 is configured to sense user's fingerprints and convert fingerprint signals into analog signals. The control circuit 12 converts the analog signals into digital signals, and generates a fingerprint image by using corresponding algorithms, thereby implementing fingerprint identification.

In an example of the present disclosure, the conductor support 2 and the dielectric cover sheet 3 are respectively structured as a cuboid.

To be specific, the dielectric cover sheet 3 is made from anisotropy dielectric materials, and artificial sapphire glass or tempered glass using aluminum oxide as a main component is preferably selected, which is used to protect internal structure, and provide a smooth interface for finger touch. With respect to the dielectric cover sheet 3, a dielectric constant between 9.3 and 11.5 is preferably selected, the thickness thereof is smaller than 350 μm, the flatness thereof is less than 10 μm, and surface figure accuracy thereof is 0.1λ. The preceding described parameters of the dielectric cover sheet 3 are only used in a preferred embodiment, which is not intended to limit the present disclosure. Color gradation of the dielectric cover sheet 3 is mainly from deposition, cladding by using a special technology, or an ink layer beneath it, in order to make the dielectric cover sheet 3 opaque to prevent a user from seeing the bottom element structures. An edge of the dielectric cover sheet 3 may be glued to the conductor holder 2 by using thermally activated membrane and sealant. In some examples of the present disclosure, to reduce the volume of the fingerprint identification apparatus 100, a sensing chip may be used as the sensing circuit 10, and a control chip may be used as the control circuit 12. In this case, the sensing chip is provided with the sensing circuit configured to sense user's fingerprints and convert the fingerprint signals into the analog signals. The sensing circuit may be packaged in a single in-line package or to a single chip, and a lower side of the sensing circuit may be additionally provided with an element, colloids may be filled for protection, or underfill may be used for protection. The sensing circuit 10 may be packaged in an epoxy resin or other elastomeric material (or alternatively, packaged in a ceramic or a transparent material with a high-dielectric constant), and then the colloid or covering material of a sensing area is removed to make the sensing area exposed to the outside, or the top portion thereof is barely exposed to form an exposed die package, such that the sensing chip occupies a small vertical space and is reasonably protected, thereby preventing the sensing chip from being damaged during assembling. The sensing circuit exhibits a capacitive connection mode, and forms another pole with a ridge and valley of fingerprints of the user. The epidermal characteristic of the user finger has a constant dielectric coefficient, and when the body fluid changes or another finger is used for touching, the read capacitance value is different, thereby achieving the objective of distinguishing different fingers or different fingerprints.

The circuit connection of the fingerprint identification module 1 is practiced via the base plate 13, and the base plate 13 may be a substrate or a flexible circuit board, or a rigid-flexible circuit board. If the base plate 13 is a substrate, it needs to consider adding the flexible circuit board 19 to the substrate in order to connect the external circuit, and the number and location of pins will be affected. If the base plate 13 is a flexible circuit board, it can be directly connected to the external circuit, and there is no need to add an additional flexible circuit board, but a COF (chip on film)/COB (chip on board) process capability is required.

In the fingerprint identification apparatus 100 in embodiments of the present disclosure, the sensing circuit 10 and the control circuit 12 are integrated into the base plate 13. The sensing circuit 10 is supported by the support member 14, and the control circuit 12 is located beneath the sensing circuit 10, such that the structure of the fingerprint identification module 1 is reduced, and further the structure of the fingerprint identification apparatus 100 is reduced, so as to facilitate assembling of the fingerprint identification apparatus 100 into the mobile terminal.

In some embodiments of the present disclosure, as illustrated in FIG. 4, the sensing circuit 10 is electrically connected to the base plate 13 via a welding wire 15, wherein the welding wire 15 may use an RSSB welding wire or other manners to lower the highest radian. Nevertheless, the present disclosure is not limited thereto, and the control circuit 10 may be further electrically connected to the base plate 13 via a silicon through hole structure, thereby preventing the problem of flatness of the dielectric cover sheet 3 after the welding wire 15 is led out from a top layer of the sensing circuit 10.

As illustrated in FIG. 4, in some embodiments of the present disclosure, the control circuit 12 is electrically connected to the base plate 13 via the welding wire 15. Nevertheless, the present disclosure is not limited thereto, and the control circuit 12 may be electrically connected to the base plate 13 via a silicon through hole structure, thereby preventing the problem of flatness of the dielectric cover sheet 3 after the welding wire 15 is led out from a top layer of the control circuit 12.

As illustrated in FIG. 4, in some embodiments of the present disclosure, the fingerprint identification module 1 further includes a first protective adhesive 16a and a second protective adhesive 16b, wherein the first protective adhesive 16a covers the welding wire 15. The second protective adhesive 16*b* is filled in a space confined between the sensing circuit 10 and the base plate 13. In other words, periphery of the sensing circuit 10 is wrapped by the first protective adhesive 16*a* and the second protective adhesive 16*b*, so as to protect the sensing circuit 10 from being damaged during assembling. In the meantime, the first protective adhesive 16*a* covers the welding wire 15 to ensure that the welding wire 15 is stable and to prevent the welding wire from collapsing. The first protective adhesive 16*a* and the second protective adhesive 16*b* may be filled and cured after the sensing circuit 10 and the control circuit 12 is assembled to the base plate 13, and the first protective adhesive 16*a* and the second protective adhesive 16*b* may be an integrally formed item.

In some embodiments of the present disclosure, as illustrated in FIG. 2 and FIG. 3, the fingerprint identification module further includes an LED lamp 17, wherein the LED lamp 17 is arranged on the base plate 13 and electrically connected to the control circuit 12. In this case, the dielectric cover sheet 3 needs to be implemented a suitable coating, which is: a semi-antireflection film needs to be coated on a place needing to display luminance, and a colorful film needs to be coated on a place with no need to display the luminance. The dielectric cover sheet 3 is provided with an identification mark (not illustrated in the drawings), wherein the identification mark may be designed into a fingerprint shape. In this way, the decorative effect of the fingerprint identification module 1 may be increased. Optionally, the LED lamp 17 may be a breath lamp.

To prevent that the luminance of the LED lamp 17 is too weak, in some embodiments of the present disclosure, the fingerprint identification module 1 further includes a buffer circuit (not illustrated in the drawings), and the LED lamp 17 is electrically connected to the control circuit 12 via the buffer circuit. As illustrated in FIG. 2, in some examples of the present disclosure, two LED lamps 17 are used and are symmetrically arranged on the base plate 13. In this way, an objective of providing a ring lamp may be achieved by arranging two LED lamps 17.

In some embodiments of the present disclosure, the conductor support 2 is connected to the dielectric cover sheet 3 via liquid adhesive, and a circumferential wall of the through hole 20 of the conductor support 2 is provided with an accommodation tank for accommodating the liquid adhesive (not illustrated in the drawings), thereby ensuring that the liquid adhesive forms a fixed structure after solidifying, and enhancing stability. In some examples of the present disclosure, a ground ring is arranged between the dielectric cover sheet 3 and the conductor holder 2.

The surface of the dielectric cover sheet 3 is lower than a top portion (between 0.1 and 0.25 mm) of the through hole 20 of the guidance support 2, thereby guiding and ensuring that a finger of the user will touch an edge of the through hole 20 of the conductor holder 2 when the finger presses the dielectric cover sheet 3, so as to form a pulse loop. Such that, the pulse signals emitted by the edge of the through hole 20 of the guidance support 2 is conducted to enable the sensing circuit 10 to read a changed value of an electric filed. Preferably, in the embodiment, a conductive terminal 18 (for example, metal terminal) is provided on the base plate 13, such that the base plate 13 and conductor holder 2 keep in electrical connection through the at least one touch point. Therefore, the control circuit 12 is electrically connected to the conductor holder 2 via the conductive terminal 18. In this way, there is no need to additionally arrange an electrode in an internal wall of the through hole 20 of the conductor support 2. As a result, raw materials and assembly cost are saved.

The sensing circuit 10 may be connected to the dielectric cover sheet 3 via liquid non-conductive adhesive or a non-conductive adhesive film. However, the thickness of the liquid non-conductive adhesive or the non-conductive adhesive film needs to be controlled to lower than 50 um to ensure that the thickness will not too thick to weaken signals, and to affect sensitivity of reading instructions.

Specifically, the dielectric cover sheet 3 may be a square, round, or other shapes capable of being applied, the surface of the dielectric cover sheet 3 is provided with a coating structure to implement an opaque effect, the color layer may be implemented by a adhesive film connecting the bottom layer and the sensing chip, or a single color layer separated from the connection adhesive film; if the surface is implemented through the coating layer, a semi-transparent level should be formed, that is, the lights emitted by the LED lamp 17 may pass through the surface, such that an illuminated mark can be seen from the top to give a guidance to users; this semi-transparent graph may be made in the traditional "HOME" button model, a fingerprint graph, or defined by users.

The fingerprint identification apparatus 100 of the present disclosure may be combined with a control button or a switching element, or may be arranged beneath a control panel of a screen of the terminal device. In a smart phone, the fingerprint identification apparatus 100 may be arranged close to a control board of a physical HOME key or a virtual HOME key. In some embodiments, a combination of a control button or a display element may be directly formed by means of the characteristics of high hardness, strong wear resistance, and the like of the sapphire glass. Alternatively, the fingerprint identification apparatus 100 may be directly embedded into a housing of a cover glass system or a fixed structure or a device. In all, some moderate adaptation adjustment may be performed according to conditions of the terminal device, such that the fingerprint features may be conveniently and sensitively identified and used as a system password lock to prevent information from leakage, and to protect privacy.

In the fingerprint identification apparatus 100 according to an embodiment of the present disclosure, the fingerprint identification module 1 has a high sensitivity and high accuracy identification rate. In addition, the fingerprint identification module 1 is flexible. As such, the module shape (round or square), indicative appearance, color, graphics, and the like may be modified based on customer's needs. In addition, the production efficiency of the fingerprint identification apparatus 100 is high, which solves a problem of connection of the flexible circuit board 19, has a high yield, and particularly enhances the decorative effect.

The mobile terminal according to an embodiment of the present disclosure includes the fingerprint identification apparatus 100 of the above embodiments of the present disclosure.

In the description of the present disclosure, it should be understood that the terms "central", "transversal", "longitudinal", "length", "width", "thickness", "upper", "lower", "front", "rear", "left", "right", "vertical", "horizontal", "top", "bottom", "inner", "outer", "axial", "radial", "circumferential" and the like indicate orientations and position relationships which are based on the illustrations in the accompanying drawings, and these terms are merely for ease and brevity of the description, instead of indicating or implying that the devices or elements shall have a particular orientation and shall be structured and operated based on the particular orientation. Accordingly, these terms shall not be construed as limiting the present disclosure.

In addition, terms of "first", "second" are only used for description, but shall not be understood as indication or implication of relative importance or implicit indication of the number of the specific technical features. Therefore, the features defined by the terms "first" and "second" may explicitly or implicitly include one or more of these features. In the description of the present disclosure, the term "more" or "a plurality of" signifies at least two, unless otherwise specified. In the description of the present disclosure, it should be noted that unless otherwise specified and defined, the terms "mounted", "coupled", "connected" and "fixed" and derivative forms thereof shall be understood in a broad sense, which, for example, may be understood as fixed connection, detachable connection or integral connection; may be understood as mechanical connection or electrical connection, or understood as direct connection, indirect connection via an intermediate medium, or communication between the interiors of two elements or interactions between two elements. Persons of ordinary skill in the art may understand the specific meanings of the above terms in the present disclosure according to the actual circumstances and contexts. In the present disclosure, unless otherwise specified or defined, by defining that a first feature is arranged "above" or "below" or "beneath" a second feature, it may be meant that the first feature is in direct contact with the second feature, or the first feature is in indirect contact with the second feature via an intermediate medium. In addition, by defining that a first feature is arranged "over" or "above" a second feature, it may be meant that the first feature is rightly over the second feature or is obliquely above the second feature, or the horizontal height of the first feature is greater than that of the second feature. In addition, by defining that a first feature is arranged "under" or "blow, or "beneath" a second feature, it may be meant that the first feature is rightly under the second feature or is obliquely below the second feature, or the horizontal height of the first feature is less than that of the second feature.

In the description of the present specification, reference terms such as "an embodiment", "some embodiments", "examples", "specific examples", "some examples", or the like are intended to refer to that the specific features, structures, materials, or characteristics which are described in combination with the embodiments or examples are included in at least one embodiment or example of the present disclosure. In this specification, schematic expressions of the above terms do not necessarily indicate the same embodiments or examples. In addition, the described specific features, structures, materials, or characteristics may be combined in any one or multiple embodiments or examples in a suitable way. In addition, in case of no contradiction, a person skilled in the art may incorporate or combine different embodiments or examples and features of different embodiments or examples described in this specification.

Although the above description illustrates the embodiments of the present disclosure, it can be understood that the embodiments are merely exemplary, and shall not be construed as limitations to the present disclosure. Persons of ordinary skill in the art may derive variations, modifications, and replacements to the above embodiments within the scope of the present disclosure.

INDUSTRIAL APPLICABILITY

In the fingerprint identification apparatus in embodiments of the present disclosure, the sensing circuit and the control circuit are integrated into the base plate. The sensing circuit is supported by the support member, and the control circuit is located beneath the sensing circuit, such that the structure of the fingerprint identification module is reduced, and further the structure of the fingerprint identification apparatus is reduced, so as to facilitate assembling of the fingerprint identification apparatus into the mobile terminal.

What is claimed is:

1. A fingerprint identification apparatus, comprising:
   a fingerprint identification circuit assembly, comprising a sensing circuit, a support member, a control circuit and a base plate, wherein the sensing circuit is arranged on the base plate via the support member and electrically connected to the base plate, and the control circuit is electrically connected to the base plate and located beneath the sensing circuit;
   a conductor holder, wherein the conductor holder being provided with a through hole, and covering the fingerprint identification circuit assembly and electrically connected to the base plate; and
   a dielectric cover sheet, the dielectric cover sheet being assembled in the through hole and connected to the sensing circuit, such that the sensing circuit collects fingerprints through the dielectric cover sheet pressed by a finger and generates an analog signal.

2. The fingerprint identification apparatus according to claim 1, wherein the sensing circuit is electrically connected to the base plate via a welding wire.

3. The fingerprint identification apparatus according to claim 2, wherein the fingerprint identification circuit assembly further comprises a first protective adhesive, wherein the first protective adhesive covering the welding wire.

4. The fingerprint identification apparatus according to claim 3, wherein the fingerprint identification circuit assembly further comprises a second protective adhesive, wherein the second protective adhesive being filled in a space confined between the sensing circuit and the base plate.

5. The fingerprint identification apparatus according to claim 1, wherein the fingerprint identification circuit assembly further comprises a light-emitting diode (LED) lamp, wherein the LED lamp being arranged on the base plate and electrically connected to the control circuit.

6. The fingerprint identification apparatus according to claim 5, wherein the fingerprint identification circuit assembly further comprises a buffer circuit and the LED lamp is electrically connected to the control circuit via the buffer circuit.

7. The fingerprint identification apparatus according to claim 5, wherein the LED lamp is a breath lamp.

8. The fingerprint identification apparatus according to claim 5, wherein two LED lamps are used and symmetrically arranged on the base plate.

9. The fingerprint identification apparatus according to claim 5, wherein the dielectric cover sheet is provided with an identification mark.

10. The fingerprint identification apparatus according to claim 1, wherein the conductor holder is connected to the dielectric cover sheet via a liquid adhesive.

11. The fingerprint identification apparatus according to claim 10, wherein a circumferential wall of the through hole of the conductor holder is provided with an accommodation tank for accommodating the liquid adhesive.

12. The fingerprint identification apparatus according to claim 1, wherein a ground ring is arranged between the dielectric cover sheet and the conductor holder.

13. The fingerprint identification apparatus according to claim 1, wherein the conductor holder and the dielectric cover sheet separately form a cuboid structure.

14. A mobile terminal, comprising a fingerprint identification apparatus, wherein the fingerprint identification apparatus comprises:

a fingerprint identification circuit assembly, comprising a sensing circuit, a support member, a control circuit and a base plate, wherein the sensing circuit is arranged on the base plate via the support member and electrically connected to the base plate, and the control circuit is electrically connected to the base plate and located beneath the sensing circuit;

a conductor holder, wherein the guide conductor holder being provided with a through hole, and covering the fingerprint identification circuit assembly and electrically connected to the base plate; and a dielectric cover sheet, the dielectric cover sheet being assembled in the through hole and connected to the sensing circuit, such that the sensing circuit collects fingerprints through the dielectric cover sheet pressed by a finger and generates an analog signal.

15. The mobile terminal according to claim 14, wherein the sensing circuit is electrically connected to the base plate via a welding wire.

16. The mobile terminal according to claim 15, wherein the fingerprint identification circuit assembly further comprises a first protective adhesive, wherein the first protective adhesive covering the welding wire.

17. The mobile terminal according to claim 16, wherein the fingerprint identification circuit assembly further comprises a second protective adhesive, wherein the second protective adhesive being filled in a space confined between the sensing circuit and the base plate.

* * * * *